(12) United States Patent
Yoon et al.

(10) Patent No.: US 10,607,765 B2
(45) Date of Patent: Mar. 31, 2020

(54) COIL COMPONENT AND BOARD HAVING THE SAME

(71) Applicant: SAMSUNG ELECTRO-MECHANICS CO., LTD., Suwon-si, Gyeonggi-do (KR)

(72) Inventors: Chan Yoon, Suwon-si (KR); Dong Hwan Lee, Suwon-si (KR); Young Ghyu Ahn, Suwon-si (KR)

(73) Assignee: SAMSUNG ELECTRO-MECHANICS CO., LTD., Suwon-si, Gyeonggi-do (KR)

( * ) Notice: Subject to any disclaimer, the term of this patent is extended or adjusted under 35 U.S.C. 154(b) by 612 days.

(21) Appl. No.: 15/229,315

(22) Filed: Aug. 5, 2016

(65) Prior Publication Data

US 2017/0148560 A1     May 25, 2017

(30) Foreign Application Priority Data

Nov. 19, 2015     (KR) .................. 10-2015-0162370

(51) Int. Cl.
| | |
|---|---|
| *H01F 27/28* | (2006.01) |
| *H01F 10/00* | (2006.01) |
| *H01F 27/255* | (2006.01) |
| *H01F 17/00* | (2006.01) |
| *H01F 17/04* | (2006.01) |
| *H01F 27/29* | (2006.01) |
| *H05K 1/18* | (2006.01) |
| *H01F 19/04* | (2006.01) |

(52) U.S. Cl.
CPC ..... *H01F 27/2804* (2013.01); *H01F 17/0013* (2013.01); *H01F 17/04* (2013.01); *H01F 27/255* (2013.01); *H01F 27/292* (2013.01); *H05K 1/181* (2013.01); *H01F 19/04* (2013.01)

(58) Field of Classification Search
CPC ...................... H01F 27/2804; H01F 17/0013
See application file for complete search history.

(56) References Cited

U.S. PATENT DOCUMENTS

| | | | |
|---|---|---|---|
| 6,768,410 B1 * | 7/2004 | Yazaki | H01F 17/0013 333/25 |
| 6,996,892 B1 * | 2/2006 | Dening | H01F 17/0013 29/602.1 |

(Continued)

FOREIGN PATENT DOCUMENTS

| | | | |
|---|---|---|---|
| JP | 11054336 A | * | 2/1999 |
| JP | 2003-151829 A | | 5/2003 |

(Continued)

OTHER PUBLICATIONS

Korean Office Action dated Nov. 9, 2016 issued in Korean Patent Application No. 10-2015-0162370 (with English translation).

*Primary Examiner* — Elvin G Enad
*Assistant Examiner* — Malcolm Barnes
(74) *Attorney, Agent, or Firm* — Morgan, Lewis & Bockius LLP

(57) ABSTRACT

A coil component and a board having the same are provided. The coil component includes: a first coil; a second coil sharing a magnetic core with the first coil; a main board disposed between the first and second coils; first and second external electrodes connected to the first coil; and third and fourth external electrodes connected to the second coil.

21 Claims, 2 Drawing Sheets

(56) References Cited

U.S. PATENT DOCUMENTS

| | | | | |
|---|---|---|---|---|
| 2003/0076211 A1* | 4/2003 | Matsuta | H01F 17/0013 | 336/200 |
| 2006/0152325 A1* | 7/2006 | Nakao | H01F 17/0013 | 336/223 |
| 2007/0030659 A1* | 2/2007 | Suzuki | H01F 17/0013 | 361/793 |
| 2007/0205856 A1* | 9/2007 | Matsunaga | H01F 17/0013 | 336/200 |
| 2008/0290977 A1* | 11/2008 | Ito | H01F 17/0013 | 336/184 |
| 2009/0072923 A1* | 3/2009 | Ishida | H01F 27/2804 | 333/25 |
| 2013/0222101 A1* | 8/2013 | Ito | H01F 17/04 | 336/83 |
| 2013/0234819 A1* | 9/2013 | Yoo | H01F 17/0013 | 336/200 |
| 2013/0249664 A1* | 9/2013 | Tonoyama | H01F 41/04 | 336/200 |
| 2014/0022041 A1* | 1/2014 | Park | H01F 17/0013 | 336/199 |
| 2014/0145812 A1* | 5/2014 | Lee | H01F 17/0013 | 336/200 |
| 2014/0167897 A1* | 6/2014 | Choi | H01F 27/255 | 336/83 |
| 2014/0327394 A1* | 11/2014 | Asselin | H01F 3/10 | 320/108 |
| 2015/0035640 A1* | 2/2015 | Wang | H01F 17/0006 | 336/200 |
| 2016/0099098 A1* | 4/2016 | Yamaguchi | H01F 17/0006 | 336/221 |
| 2017/0092413 A1* | 3/2017 | Matsunaga | H01F 27/245 | |

FOREIGN PATENT DOCUMENTS

| | | | |
|---|---|---|---|
| JP | 2008072071 A | * | 3/2008 |
| JP | 2008166625 A | * | 7/2008 |
| JP | 2014229739 A | * | 12/2014 |
| KR | 10-2008-0102993 A | | 11/2008 |
| KR | 10-2014-0066437 A | | 6/2014 |
| KR | 10-2015-0035947 A | | 4/2015 |
| KR | 10-1558092 B1 | | 10/2015 |
| KR | 10-2015-0127490 A | | 11/2015 |

* cited by examiner

A-A'

COIL COMPONENT AND BOARD HAVING THE SAME

CROSS-REFERENCE TO RELATED APPLICATION

This application claims the benefit of priority to Korean Patent Application No. 10-2015-0162370, filed on Nov. 19, 2015 with the Korean Intellectual Property Office, the entirety of which is incorporated herein by reference.

BACKGROUND

The present disclosure relates a coil component and a board having the same.

Electronic products such as digital televisions (TV), smartphones, laptop computers, and the like, widely use a function of transmitting and receiving data in a high frequency band. In the future, it is expected that these information technology (IT) electronic products will not only be used by themselves, but will also be connected to each other through a universal serial bus (USB) or another communications port, and thus they will be multi-functionalized and made even more intricate.

In accordance with the development of the smartphone, there is increased demand for a thinned power inductor having a high current, high efficiency, high performance, and a compact size.

Therefore, a product having a 2520 size and a thickness of 1 mm to a product having a 2016 size and a thickness of 1 mm have been used, and will be miniaturized to a product having a 1608 size and a thickness of 0.8 mm.

At the same time, there is also increased demand for an inductor array having an advantage such as a reduction in a mounting area.

The inductor array may have a non-coupled or coupled inductor form or a mixed form of the non-coupled inductor form and the coupled inductor form depending on a coupling coefficient or a mutual inductance between a plurality of coil parts.

In a coupled inductor, a leakage inductance is associated with an output current ripple, and a mutual inductance is associated with an inductor current ripple. In order for the coupled inductor to have the same output current ripple as that of an existing non-coupled inductor, the leakage inductance of the coupled inductor should be the same as a mutual inductance of the existing non-coupled inductor. In addition, when the mutual inductance is increased, a coupling coefficient (k) is increased, and thus the inductor current ripple may be decreased.

Therefore, when the coupled inductor may have a decreased inductor current ripple while having the same output current ripple as that of the existing non-coupled inductor at the same size as that of the existing non-coupled inductor, efficiency of the inductor array may be increased without an increase in a mounting area.

Therefore, in order to increase the efficiency of the inductor array while maintaining a size of the inductor array, there has been research into developing a coupled inductor in which a coupling coefficient is increased by increasing a mutual inductance.

In the coupled inductor, an interval between coils should be decreased in order to increase the coupling coefficient. However, there is a limitation in a process in decreasing the interval. Therefore, a method of increasing the coupling coefficient between the coils while overcoming the limitation in the process described above has been demanded.

SUMMARY

An aspect of the present disclosure provides a coil component in which a coupling coefficient between a plurality of coils is increased, and a board having the same.

According to an aspect of the present disclosure, a coil component includes: a first coil; a second coil sharing a magnetic core with the first coil and wound in a direction that is the same as or is opposite to a direction in which the first coil is wound; a main board disposed between the first and second coils; first and second external electrodes connected to the first coil; and third and fourth external electrodes connected to the second coil. According to another aspect of the present disclosure, a board may have the coil component described above.

In this case, since the main board is disposed in a space between the first and second coils, a magnetic flux generated in the magnetic core of the first coil may be transferred to the magnetic core of the second coil without being leaked. Therefore, a coil component in which a mutual inductance and a coupling coefficient (k) are increased, and a board having the same, may be provided.

BRIEF DESCRIPTION OF DRAWINGS

The above and other aspects, features, and advantages of the present disclosure will be more clearly understood from the following detailed description taken in conjunction with the accompanying drawings, in which.

DETAILED DESCRIPTION

Figure 1:
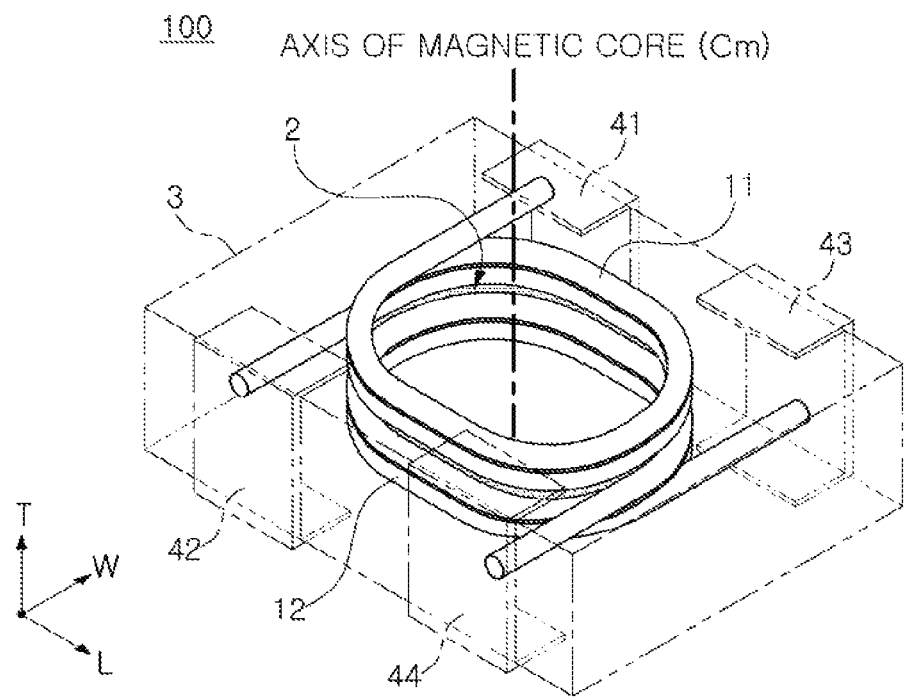
FIG. 1 is a schematic perspective view of a coil component according to an exemplary embodiment in the present disclosure.

Hereinafter, embodiments of the present disclosure will be described as follows with reference to the attached drawings.

The present disclosure may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "on," "connected to," or "coupled to" another element, it can be directly "on," "connected to," or "coupled to" the other element or other elements intervening therebetween may be present. In contrast, when an element is referred to as being "directly on," "directly connected to," or "directly coupled to" another element, there may be no other elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the exemplary embodiments.

Spatially relative terms, such as "above," "upper," "below," and "lower" and the like, may be used herein for ease of description to describe one element's relationship relative to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" relative to other elements would then be oriented "below," or "lower" relative to the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein describes particular embodiments only, and the present disclosure is not limited thereby. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments of the present disclosure will be described with reference to schematic views illustrating embodiments of the present disclosure. In the drawings, for example, due to manufacturing techniques and/or tolerances, modifications of the shape shown may be estimated. Thus, embodiments of the present disclosure should not be construed as being limited to the particular shapes of regions shown herein, for example, to include a change in shape results in manufacturing. The following embodiments may also be constituted by one or a combination thereof.

The contents of the present disclosure described below may have a variety of configurations and propose only a required configuration herein, but are not limited thereto.

Hereinafter, a coil component and a board having the same according to an exemplary embodiment in the present disclosure will be described. However, the present disclosure is not limited thereto.

Coil Component

FIG. 1 is a perspective view of a coil component according to an exemplary embodiment in the present disclosure.

Referring to FIG. 1, a coil component 100 according to an exemplary embodiment in the present disclosure may include a first coil 11 and a second coil 12. The first and second coils may share a magnetic core with each other, and may be wound in the same direction or may be wound in opposite directions.

The first and second coils may have a spiral shape, but are not limited thereto. In addition, a method of forming the first and second coils is not particularly limited. Therefore, the first and second coils may be any one of a winding type coil formed by winding a coil several times, a thin film type coil formed by performing electroplating on an insulating substrate, and a multilayer type coil formed by printing coil patterns on a plurality of magnetic sheets and then stacking the plurality of magnetic sheets on which the coil patterns are printed, but are not limited thereto.

The coil component 100 may include a magnetic body 3 including the first and second coils 11 and 12 disposed therein. The magnetic body 3 may have a hexahedral shape, but is not limited thereto.

In FIG. 1, an "L-direction" refers to a length direction of the magnetic body 3, a "W-direction" refers to a width direction of the magnetic body 3, and a "T-direction" refers to a thickness direction of the magnetic body 3.

The magnetic body 3 may form a body of a coil component, and may be formed of any material that exhibits magnetic properties. For example, the magnetic body 3 may be formed by providing ferrite or a metal based soft magnetic material. The ferrite may be ferrite such as a Mn—Zn based ferrite, a Ni—Zn based ferrite, a Ni—Zn—Cu based ferrite, a Mn—Mg based ferrite, a Ba based ferrite, a Li based ferrite, or the like. In addition, the metal based soft magnetic material may be an alloy containing one or more selected from the group consisting of Fe, Si, Cr, Al, and Ni. For example, the metal based soft magnetic material may contain Fe—Si—B—Cr based amorphous metal particles, but is not limited thereto. The metal based soft magnetic material may have a particle diameter within a range of 0.1 μm to 20 μm, and may be contained in a polymer such as an epoxy resin, polyimide, or the like, in a form in which it is dispersed on the polymer.

The coil component 100 may include first to fourth external electrodes 41 to 44 disposed on outer surfaces of the magnetic body. The first external electrode 41 may be connected to one end portion of the first coil 11, and the second external electrode 42 may be connected to the other end portion of the first coil 11. In addition, the third external electrode 43 may be connected to one end portion of the second coil 12, and the fourth external electrode 44 may be connected to the other end portion of the second coil 12.

Here, the first and third external electrodes 41 and 43 may be input terminals, and the second and fourth external electrodes 42 and 44 may be output terminals.

The first to fourth external electrodes 41 to 44 may be formed of a metal having excellent electrical conductivity, such as copper (Cu), silver (Ag), nickel (Ni), tin (Sn), or the like, alloys thereof.

A main board 2 may be disposed between the first and second coils 11 and 12. The first coil 11 may be disposed on an upper surface of the main board 2, and the second coil 12 may be disposed on a lower surface of the main board 2. The first and second coils 11 and 12 may be disposed on the upper and lower surfaces of the main board 2, respectively, to be symmetrical to each other in relation to the main board 2. Here, a term "symmetrical" means that materials and structures of the first and second coils 11 and 12, area occupied by the first and second coils 11 and 12, and lengths of the first and second coils 11 and 12 are the same as each other and the first and second coils 11 and 12 are disposed on the upper and lower surfaces of the main board 2, respectively.

The first and second coils 11 and 12 may be disposed to be spaced apart from each other by a thickness of the main board 2 or a thickness greater than that of the main board 2. In a case in which the first and second coils 11 and 12 are disposed to be spaced apart from each other by the thickness of the main board 2, a lower surface of the first coil 11 may contact the upper surface of the main board 2, and an upper surface of the second coil 12 may contact the lower surface of the main board 2.

The first and second coils 11 and 12 may be physically disconnected from each other by the main board 2. Here, the phrase "physically disconnected from each other" means that the main board 2 does not include a separate component for connecting the first and second coils 11 and 12 to each other. For example, the main board 2 may not include via holes for connecting the first and second coils 11 and 12 to each other.

A through-hole may be disposed in a central portion of the main board 2, and the center of gravity of the through-hole may be formed on the magnetic core Cm shared by the first and second coils 11 and 12.

The main board 2 may be formed of any material that does not have a magnetic property. For example, the main board 2 may be a printed circuit board (PCB), but is not limited thereto. The main board may be formed of a non-magnetic material.

Since the main board 2 is disposed in a space between the first and second coils 11 and 12, a phenomenon that a magnetic flux flowing from the first coil 11 to the second coil 12 is leaked to the space between the first and second coils 11 and 12 may be prevented. As a result, a mutual inductance (Lm) between the first and second coils 11 and 12 may be increased, and a coupling coefficient (k) of the coil component may be increased.

The main board 2 may not include an opening except for the through-hole disposed in the central portion of the main board 2, and the through-hole may have the same shape as that of a cross section of a region in which a magnetic material is provided in the magnetic core of the first and second coils 11 and 12. In addition, a shape of the upper surface of the main board 2 may be the same as that of the lower surface of the first coil 11 disposed on the upper surface of the main board 2, and a shape of the lower surface of the main board 2 may be the same as that of the upper surface of the second coil 12 disposed on the lower surface of the main board 2.

Figure 2:
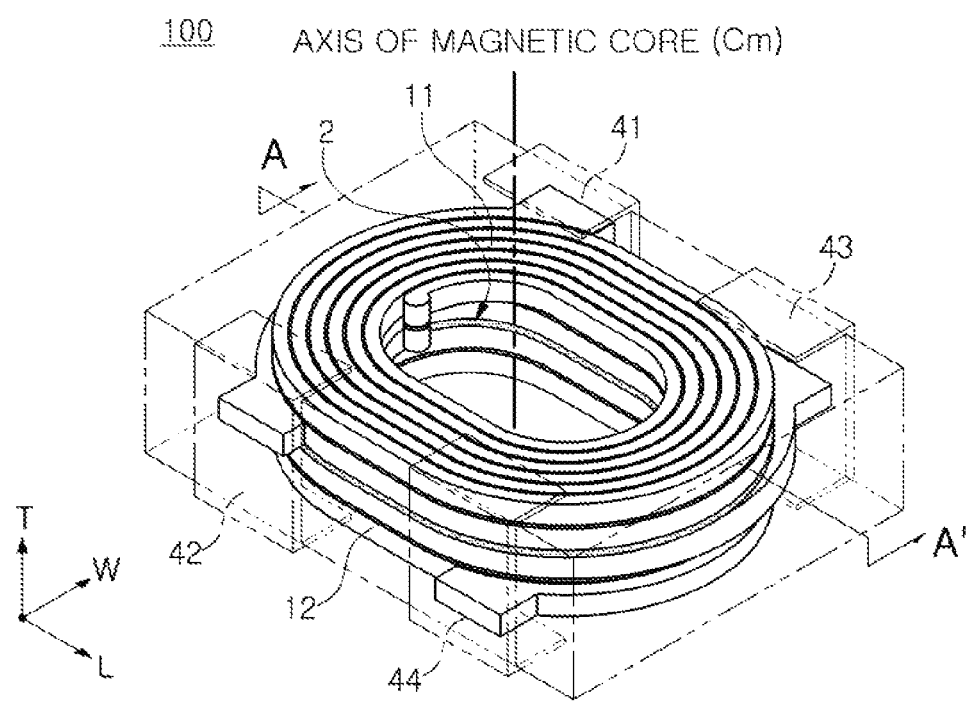
FIG. 2 is a schematic perspective view of a coil component according to a modified example of FIG. 1.
Figure 3:
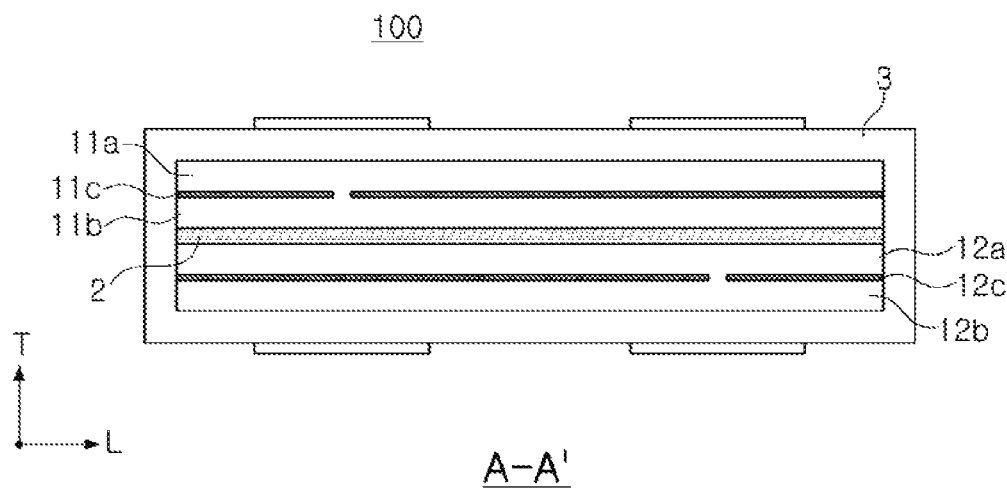
FIG. 3 is a schematic cross-sectional view taken along line A-A' of FIG. 2.

FIG. 2 is a schematic perspective view of a coil component according to a modified example of FIG. 1; and FIG. 3 is a schematic cross-sectional view taken along line A-A' of FIG. 2.

Referring to FIG. 3, a first coil 11 may include a first coil pattern 11a and a second coil pattern 11b with a first substrate 11c interposed therebetween, and a second coil 12 may include a third coil pattern 12a and a fourth coil pattern 12b with a second substrate 12c interposed therebetween.

Referring to FIG. 2, one end portion of the first coil pattern 11a of the first coil 11 may be connected to the first external electrode 41, and one end portion of the second coil pattern 11b of the first coil 11 may be connected to the second external electrode 42. The first coil pattern 11a may be electrically connected to the second coil pattern 11b by a via penetrating through the first substrate 11c.

In addition, one end portion of the third coil pattern 12a of the second coil 12 may be connected to the third external electrode 43, and one end portion of the fourth coil pattern 21b of the second coil 12 may be connected to the fourth external electrode 44. The third coil pattern 12a may be electrically connected to the fourth coil pattern 12b by a via penetrating through the second substrate 12c.

The first and third external electrodes 41 and 43 may be input terminals, and the second and fourth external electrodes 42 and 44 may be output terminals. In detail, a current input from the first external electrode 41, which is the input terminal, may pass through the first coil pattern 11a, the via penetrating through the first substrate 11c, and the second coil pattern 11b, and then flow to the second external electrode 42, which is the output terminal. Likewise, a current input from the third external electrode 43, which is the input terminal, may pass through the third coil pattern 12a, the via penetrating through the second substrate 12c, and the fourth coil pattern 12b, and then flow to the fourth external electrode 44, which is the output terminal.

The first and second substrates 11c and 12c may be magnetic substrates, such as polypropylene glycol (PPG) substrates, ferrite substrates, metal based soft magnetic substrates, or the like.

In addition, the first to fourth coil patterns, the via penetrating through the first substrate, and the via penetrating through the second substrate may be formed of a metal having excellent electrical conductivity, such as silver (Ag), palladium (Pd), aluminum (Al), nickel (Ni), titanium (Ti), gold (Au), platinum (Pt), or alloys thereof.

The first and second coil patterns 11a and 11b may be formed by performing electroplating on the first substrate 11c, and the third and fourth coil patterns 12a and 12b may be formed by performing electroplating on the second substrate 12c. However, the first to fourth coil patterns are not limited thereto.

Next, referring to FIG. 3, a distance (L) between the first and second coils 11 and 12 may be the same as a thickness of the main board 2 interposed between the first and second coils 11 and 12, or may be larger than the thickness of the main board 2.

In a case in which the distance (L) between the first and second coils 11 and 12 is the same as the thickness of the main board 2 interposed between the first and second coils 11 and 12, a lower surface of the first coil 11 may contact the upper surface of the main board 2, and an upper surface of the second coil 12 may contact the lower surface of the main board 2.

In a case in which the distance (L) between the first and second coils 11 and 12 is thicker than the thickness of the main board 2 interposed between the first and second coils 11 and 12, a magnetic material may be provided in a space formed between the lower surface of the first coil 11 and the upper surface of the main board 2, and may be provided in a space formed between the upper surface of the second coil 12 and the lower surface of the main board 2. A kind and a content of the magnetic material may be the same as those of the magnetic material provided in the magnetic body of the coil component.

The main board 2 may have a thickness great enough to support the first and second coils 11 and 12 between which it is interposed. For example, the main board 2 may have a thickness within the range of 40 μm to 120 μm, but is not limited thereto.

A method of manufacturing a coil component according to an exemplary embodiment will be a manufacturing method to be described below by way of example, but is not limited only thereto.

First, a hole may be formed in the first substrate in order to form a via. A plating resist having opening parts for forming the first and second coil patterns may be formed in order to form the first and second coil patterns on the first substrate. The plating resist, which is a general photosensitive resist film, may be a dry film resist, or the like, but is not particularly limited thereto. An electrical conductive metal may be provided in the opening parts for forming the first and second coil patterns by a process such as electroplating, or the like, thereby forming the first and second coil patterns. In this case, a via hole that has already been formed may be filled with an electrical conductive metal to electrically connect the first and second coil patterns to each other through the via. Then, the plating resist may be removed by a process such as chemical etching, or the like. Here, the first and second coil patterns may also be simultaneously formed. Likewise, the third and fourth coil patterns may be formed on the second substrate. In addition, the first coil (the first and second coil patterns) and the second coil (the third and fourth coil patterns) may be disposed on one surface of the main board and the other surface of the main board opposing one surface of the main board, respectively.

In a case of the coil component according to an exemplary embodiment in the present disclosure, since the main board 2 is disposed in the space between the first and second coils 11 and 12, most of the magnetic flux generated in the magnetic core of the first coil 11 may be transferred to the magnetic core of the second coil 12 without being leaked to the space between the first and second coils 11 and 12. Therefore, the mutual inductance (Lm) between the first and second coils 11 and 12 may be significantly increased. As a result, the coupling coefficient (k) of the coil component may be significantly increased.

Conversely, in a case of the coil component according to the related art, since a magnetic material is provided in the space between the first and second coils, the magnetic flux generated in the magnetic core of the first coil may be leaked to the space between the first and second coils. In this case, since all of the magnetic flux generated in the magnetic core of the first coil is not transferred to the magnetic core of the second coil, the mutual inductance (Lm) between the first and second coils may not be significantly improved.

Table 1 represents self-inductances, direct current (DC) resistance (Rdc), and coupling coefficients of a coil component (Inventive Example 1) according to an exemplary embodiment in the present disclosure and a coil component (Comparative Example 1) according to the related art.

In Table 1, the coil component according to Comparative Example 1 and the coil component according to Inventive Example 1 may have substantially the same structure except that the same magnetic material as the magnetic material provided in the magnetic body is provided in the space between the first and second coils in the coil component according to Comparative Example 1, while the main board contacting the lower surface of the first coil and the upper surface of the second coil is disposed in the space between the first and second coils in the coil component according to Inventive Example 1.

In Inventive Example 1 and Comparative Example 1 of Table 1, both the interval (L) between the first and second coils and the thickness of the main board may be 60 μm, and the first coil, the main board, and the second coil may sequentially contact each other in relation to the T-direction of the magnetic body.

TABLE 1

|  | Inventive Example 1 | | Comparative Example 1 | |
| --- | --- | --- | --- | --- |
|  | First Coil | Second Coil | First Coil | Second Coil |
| Self-Inductance [μH] | 1.973 | 1.973 | 2.4326 | 2.4326 |
| Rdc [mOhm] | 174.52 | 174.52 | 174.52 | 174.52 |
| Coupling Coefficient (k) | −0.90225 | | −0.55582 | |

As seen in Table 1, DC resistances (Rdc) of the first and second coils of the coil component according to Inventive Example 1 coincides with those of the first and second coils of the coil component according to Comparative Example 1. The reason is that the DC resistances of the first and second coils are determined by three factors such as specific resistances defined by materials, or the like, of the first and second coils, areas of the first and second coils, and lengths of the first and second coils, and the first and second coils used in Inventive Example 1 are the same as the first and second coils used in Comparative Example 1.

Meanwhile, in Table 1, self inductances (Ls) of the first and second coils of the coil component according to Inventive Example 1 are lower than those of the first and second coils of the coil component according to Comparative Example 1. The reason is that the magnetic material is also provided in the lower surface of the first coil and the upper surface of the second coil in the coil component according to Comparative Example 1, and thus a packing factor of the magnetic material in regions adjacent to the first and second coils is higher than that in the coil component according to Inventive Example 1.

Referring to coupling coefficients of Table 1, the closer the absolute value of the coupling coefficient to 1, the larger the coupling coefficient, and a negative (−) sign means negative coupling. In this case, it may be appreciated that a coupling coefficient of the coil component according to Inventive Example 1 is increased as compared to that of the coil component according to Comparative Example 1 by about 62%. This means that the magnetic flux generated in the magnetic core of the first coil is transferred to the magnetic core of the second coil without being leaked.

As a result, according an exemplary embodiment, the coupling coefficient of the coil component may be significantly improved, and thus an inductor current ripple may be decreased, and overall efficiency of a DC to DC converter may be increased.

Board Having Coil Component

Figure 4:
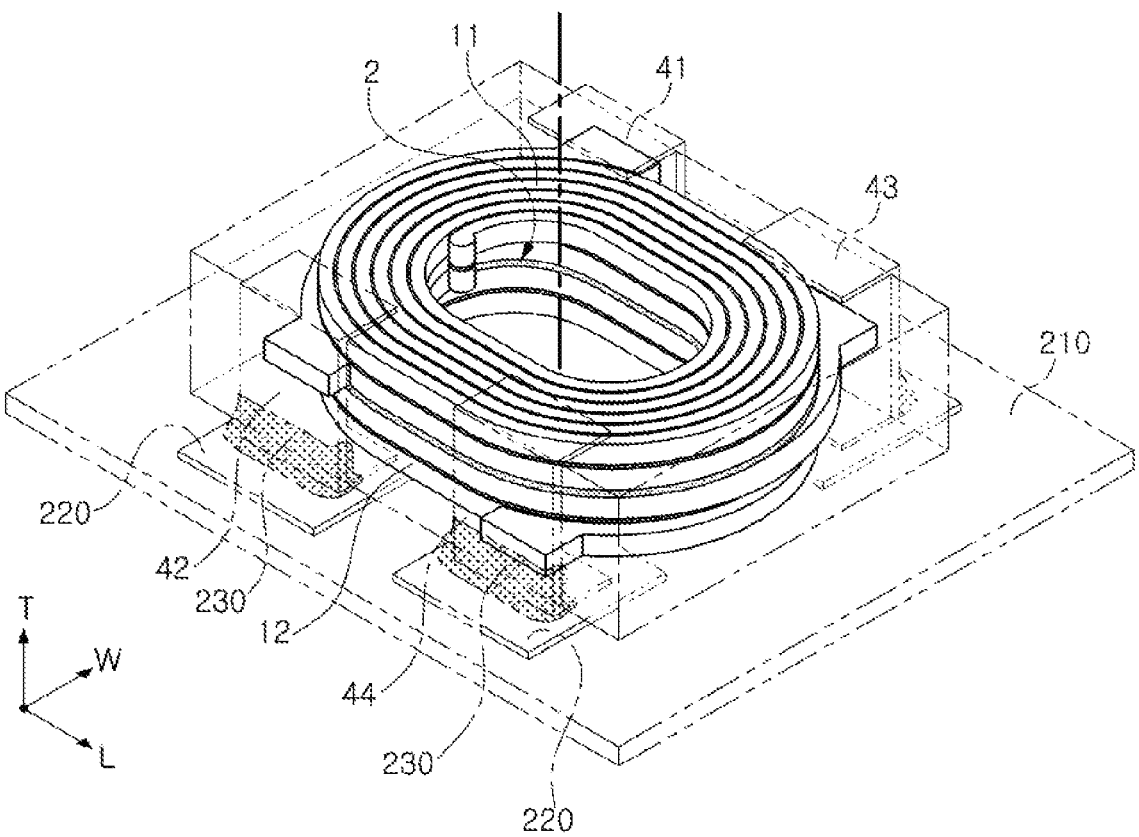
FIG. 4 is a schematic perspective view illustrating a board in which the coil component of FIG. 2 is mounted on a board.

FIG. 4 is a schematic perspective view illustrating a board in which the coil component of FIG. 2 is mounted on a board.

Referring to FIG. 4, a board 200 having a coil component according to an exemplary embodiment in the present disclosure may include a printed circuit board 210 on which the coil component 100 is mounted to be parallel to the printed circuit board, and a plurality of electrode pads 220 formed on an upper surface of the printed circuit board 210 to be spaced apart from each other.

In this case, the phrase "coil component is mounted to be parallel to the printed circuit board" means that the magnetic core Cm shared by the first and second coils in the coil component is formed perpendicularly to the upper surface of the printed circuit board 210.

Meanwhile, the first to fourth external electrodes 41 to 44 of the coil component may be electrically connected to the printed circuit board 210 by solders 230 in a state in which they are positioned on the electrode pads 220, respectively, to contact the electrode pads 220, respectively.

A description of features overlapping those of the coil component according to the exemplary embodiment in the present disclosure described above except for the above-mentioned description will be omitted.

As set forth above, according to an exemplary embodiment in the present disclosure, the coil component of which efficiency is improved by increasing the coupling coefficient between the first and second coils without changing an interval between the first and second coils disposed in the magnetic body to share one magnetic core with each other, and the board having the same, may be provided.

According to an exemplary embodiment in the present disclosure, the coil component in which the mutual inductance (Lm) and the coupling coefficient (k) between the first and second coils are increased without changing a mounting area and having a limitation in a process, and the board having the same, may be provided.

While exemplary embodiments have been shown and described above, it will be apparent to those skilled in the art that modifications and variations could be made without departing from the scope of the present invention as defined by the appended claims.

What is claimed is:

1. A coil component comprising:
   a first coil;
   a second coil sharing a magnetic core with the first coil;
   a main board disposed between the first and second coils;
   first and second external electrodes connected to the first coil; and
   third and fourth external electrodes connected to the second coil,
   wherein the first coil includes:
     a first coil pattern disposed on a first surface of a first substrate, and the first coil pattern being connected to the first external electrode, and
     a second coil pattern disposed on a second surface of the first substrate opposite the first surface of the first substrate, and the second coil pattern being connected to the second external electrode,
   wherein the second coil includes:
     a third coil pattern disposed on a first surface of a second substrate, and the third coil pattern being connected to the third external electrode, and
     a fourth coil pattern disposed on a second surface of the second substrate opposite the first surface of the second substrate, and the fourth coil pattern being connected to the fourth external electrode, and
   wherein the first substrate is selected from the group consisting of a magnetic substrate, a polypropylene glycol substrate, and a metal based soft magnetic substrate, and
   the second substrate is selected from the group consisting of a magnetic substrate, a polypropylene glycol substrate, and a metal based soft magnetic substrate.

2. The coil component of claim 1, wherein the first and second coils are spaced apart from each other by a predetermined interval, and the second coil is physically disconnected from the first coil by the main board.

3. The coil component of claim 1, wherein a distance between the first and second coils is the same as or larger than a thickness of the main board.

4. The coil component of claim 1, wherein the main board has a through-hole disposed in a central portion thereof, and a center of gravity of the through-hole is formed on the magnetic core shared by the first and second coils.

5. The coil component of claim 1, wherein the main board prevents a magnetic flux flowing from the first coil to the second coil from being leaked.

6. The coil component of claim 1, wherein the main board is a printed circuit board (PCB), and does not include an opening except for a through-hole disposed in a central portion thereof.

7. The coil component of claim 1, wherein the main board has a thickness within a range of 40 µm to 120 µm.

8. The coil component of claim 1, wherein the main board is formed of a non-magnetic material.

9. The coil component of claim 1, wherein the first coil includes a first coil pattern disposed on a first surface of a first substrate and a second coil pattern disposed on a second surface of the first substrate opposite the first surface of the first substrate, the first coil pattern being connected to the first external electrode, and the second coil pattern being connected to the second external electrode, and the second coil includes a third coil pattern disposed on a first surface of a second substrate and a fourth coil pattern disposed on a second surface of the second substrate opposite the first surface of the second substrate, the third coil pattern being connected to the third external electrode, and the fourth coil pattern being connected to the fourth external electrode.

10. The coil component of claim 1, wherein the first and third external electrodes are input terminals, and the second and fourth external electrodes are output terminals.

11. The coil component of claim 9, wherein the first coil pattern is connected to the second coil pattern by a via penetrating through the first substrate, and the third coil pattern is connected to the fourth coil pattern by a via penetrating through the second substrate.

12. The coil component of claim 9, wherein the first substrate includes a through-hole forming a first magnetic core of the first coil, and the second substrate includes a through-hole forming a second magnetic core of the second coil, and
   centers of gravity of the through-holes of the first and second substrates coincide with that of a through-hole of the main board.

13. The coil component of claim 9, wherein the first and second substrates are magnetic substrates.

14. The coil component of claim 13, wherein the first and second substrates are polypropylene glycol (PPG) substrates, ferrite substrates, or metal based soft magnetic substrates.

15. The coil component of claim 9, wherein the first and second substrates do not contact the main board.

16. A board having a coil component, comprising:
   a printed circuit board having a plurality of electrode pads disposed thereon; and
   the coil component installed on the printed circuit board, wherein the coil component includes:
     a first coil;
     a second coil sharing a magnetic core with the first coil;
     a main board disposed between the first and second coils;
     first and second external electrodes connected to the first coil; and
     third and fourth external electrodes connected to the second coil,
   wherein the first coil includes:
     a first coil pattern disposed on a first surface of a first substrate, and the first coil pattern being connected to the first external electrode, and
     a second coil pattern disposed on a second surface of the first substrate opposite the first surface of the first substrate, and the second coil pattern being connected to the second external electrode,
   wherein the second coil includes:
     a third coil pattern disposed on a first surface of a second substrate, and the third coil pattern being connected to the third external electrode, and
     a fourth coil pattern disposed on a second surface of the second substrate opposite the first surface of the second substrate, and the fourth coil pattern being connected to the fourth external electrode, and wherein the first substrate is selected from the group consisting of a magnetic substrate, a polypropylene glycol substrate, and a metal based soft magnetic substrate, and the second substrate is selected from the group consisting of a magnetic substrate, a polypropylene glycol substrate, and a metal based soft magnetic substrate.

17. The board having a coil component of claim 16, wherein the first and second coils are spaced apart from each other by a predetermined interval, and the second coil is physically disconnected from the first coil by the main board.

18. The board having a coil component of claim 16, wherein the main board is a PCB, and has a through-hole disposed in a central portion thereof.

19. The board having a coil component of claim 16, wherein the first coil includes a first coil pattern disposed on a first surface of a first substrate and a second coil pattern disposed on a second surface of the first substrate opposite the first surface of the first substrate, the first coil pattern being connected to the first external electrode, and the second coil pattern being connected to the second external electrode, and the second coil includes a third coil pattern disposed on a first surface of a second substrate and a fourth coil pattern disposed on a second surface of the second substrate opposite the first surface of the second substrate, the third coil pattern being connected to the third external electrode, and the fourth coil pattern being connected to the fourth external electrode.

20. The board having a coil component of claim 16, wherein the main board has a thickness within a range of 40 μm to 120 μm, and is formed of a non-magnetic material.

21. A coil component comprising:
a first coil;
a second coil sharing a magnetic core with the first coil;
a main board disposed between the first and second coils;
first and second external electrodes connected to the first coil; and
third and fourth external electrodes connected to the second coil,
wherein the first coil includes:
a first coil pattern disposed on a first surface of a first substrate, and the first coil pattern being connected to the first external electrode, and
a second coil pattern disposed on a second surface of the first substrate opposite the first surface of the first substrate, and the second coil pattern being connected to the second external electrode,
wherein the second coil includes:
a third coil pattern disposed on a first surface of a second substrate, and the third coil pattern being connected to the third external electrode, and
a fourth coil pattern disposed on a second surface of the second substrate opposite the first surface of the second substrate, and the fourth coil pattern being connected to the fourth external electrode, and
wherein the first and second substrates do not contact the main board.

* * * * *